United States Patent
Chang

(10) Patent No.: US 6,682,977 B2
(45) Date of Patent: Jan. 27, 2004

(54) METHOD FOR FABRICATING A GATE STRUCTURE OF A FLASH MEMORY

(75) Inventor: Shu-Cheng Chang, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 15 days.

(21) Appl. No.: 10/071,187

(22) Filed: Feb. 11, 2002

(65) Prior Publication Data

US 2003/0153148 A1 Aug. 14, 2003

(51) Int. Cl.⁷ .............................................. H01L 21/336
(52) U.S. Cl. ...................... 438/257; 438/259; 438/264; 438/266
(58) Field of Search ................................ 438/257, 258, 438/259, 260, 261, 262, 263, 264, 265, 266, 267; 257/314–322

(56) References Cited

U.S. PATENT DOCUMENTS

| | | | | |
|---|---|---|---|---|
| 6,153,472 A | * | 11/2000 | Ding et al. ................. | 438/264 |
| 6,468,862 B1 | * | 10/2002 | Tseng ......................... | 438/259 |
| 2002/0025631 A1 | * | 2/2002 | Bez et al. ................... | 438/257 |

* cited by examiner

Primary Examiner—Jack Chen
(74) Attorney, Agent, or Firm—Dickinson Wright PLLC

(57) ABSTRACT

A method for fabricating a gate of a flash memory is described. A tunneling oxide layer, a first polysilicon layer and a silicon nitride layer are sequentially formed on a substrate. A photo-resist layer is formed on the silicon nitride layer and then the photo-resist layer, the silicon nitride layer, the polysilicon layer, the tunneling oxide layer and the substrate are patterned to form a plurality of trenches in the substrate. An active area defined by every two trenches is simultaneously formed. The photo-resist layer is removed. A plurality of shallow trench isolation (STI) structures is formed in the trenches by filling the trenches with silicon oxide up to the top of the silicon nitride layer. The top portion of the shallow trench isolation structures is removed to expose the sidewall of the silicon nitride layer and the top portion of the sidewall of the first polysilicon layer. Part of the silicon nitride layer is removed by wet etching. Then, a second polysilicon layer is formed on the active area and the shallow trench isolation structures. The second polysilicon layer is etched anisotropically to further expose the top face of the shallow trench isolation structures to form a floating gate. The remaining silicon nitride layer is removed. A conformal dielectric layer is formed over the substrate. A third polysilicon layer is formed on the dielectric layer as a control gate.

26 Claims, 4 Drawing Sheets

METHOD FOR FABRICATING A GATE STRUCTURE OF A FLASH MEMORY

BACKGROUND OF THE INVENTION

1. Field of Invention

The present invention relates to a semiconductor fabrication method. More particularly, the present invention relates to a method for fabricating a flash memory device, which can provide a larger coupling ratio between the floating gate and the control gate and which further has a high memory cell density.

2. Description of Related Art

Currently, a flash memory with a high memory cell density has significant applications in various apparatus designs. One main advantage of the flash memory is that each memory cell can be fabricated with greatly reduced dimensions, and fabrication cost is also greatly reduced. In a conventional flash memory, memory cells are isolated by a field oxide (FOX) structure that is formed by local oxidation (LOCOS). The dimensions of the FOX structure can only be reduced within certain limits. As a result, cell density is also limited.

Another typical isolation structure is a shallow trench isolation (STI) structure. Since the STI structure can be formed in a much smaller area than the FOX structure, application of the STI structure in a flash memory can effectively minimize the cell dimension so that the cell density can be ultimately increased.

However, in this method, an overlapping area between a floating gate and a control gate of the flash memory is accordingly small. This results in a smaller coupling ratio. A smaller coupling ratio creates a need for a higher bias to be applied on the control gate when erasing the information stored in the memory cells. Moreover, the flash memory with a smaller coupling ratio requires a higher electric field to obtain a Fowler-Nordheim (F-N) tunneling effect, and results in a lower electron transmission rate between the floating gate and a source/drain region. The read/write operation therefore becomes slower. All the above problems are induced by a lower coupling ratio, which further results from dimensions being too small. The dimensions of the flash memory cell cannot be further reduced. It is a goal to fabricate a flash memory having high cell density and a high coupling rate.

Reference is made to FIG. 1, wherein a schematic, cross-sectional view of an "elephant-ears" floating gate used to increase the coupling ratio between the floating gate and control gate is illustrated. The "elephant-ears" floating gate is fabricated by first defining the trenches (not shown in the FIG. 1) for forming shallow trench isolation (STI) structures 102 in the substrate 100 by the first photolithographic and etching processes. Then, the trenches are filled with oxide and the STI structures 102 are formed in the trenches. The STI structures 102 are higher than the surface of the substrate 100. A tunneling oxide layer 104 is formed on the substrate 100. A polysilicon layer (not shown in the FIG. 1) is deposited cover the tunneling oxide layer 104 and STI structures 102.

With further reference to FIG. 1, a floating gate 106 is defined by the second photolithographic and etching processes on the polysilicon layer. A dielectric layer 108 is deposited and covers the floating gate 106 and STI structure 102. Finally, a polysilicon layer 110 is formed on the dielectric layer 108. The polysilicon layer 110 is a control gate. Because the floating gate 106 has two "ear" structures on the STI structure 102, it is called an "elephant-ears" structure.

Compared with traditional stacked flash memory, the "elephant-ears" stacked flash memory has a higher coupling ratio between the floating gate and control gate. However, when each memory cell is fabricated under greatly reduced dimensions, the window for alignment in forming the floating gate 106 decreases and misalignment becomes a problem.

SUMMARY OF THE INVENTION

In accordance with the above background of the invention, the conventional method of manufacturing a gate structure of a stacked flash memory has disadvantages. The misalignment in defining the floating gate will decrease the yield and since the conventional method needs two photolithographic processes to define the gate structure, fabrication costs cannot be lowered. Therefore, it is necessary to find a process for manufacturing highly integrated submicron semiconductors having a stacked flash memory structure that improves upon the conventional disadvantages. It is therefore an objective of the present invention to provide a method for fabricating a gate structure of a stacked flash memory, in which the coupling ratio between the floating gate and control gate is increased.

It is another object of the present invention to provide a method for fabricating a gate structure of a stacked flash memory, in which only one photolithographic and etching process is needed, thereby reducing costs of manufacture.

It is still another object of the present invention to provide a method for fabricating a gate structure of a stacked flash memory, in which the floating gate is defined by a self-aligned process. The self-aligned process avoids misalignment in forming the floating gate and the yield will increase.

In accordance with the foregoing and other objects of the present invention, a method for fabricating a gate of a flash memory is provided. A tunneling oxide layer, a first conductive layer and a dielectric layer are sequentially formed on a substrate, wherein the material for forming the first conductive layer comprises polysilicon and the material for forming the dielectric layer comprises silicon nitride. Typically, the tunneling oxide layer is formed by a thermal process. The first conductive layer and the dielectric layer are formed by a chemical vapor deposition (CVD) process.

A photo-resist layer is formed on the dielectric layer by spinning or vapor coating and the photo-resist layer is patterned by exposure and development process. Using the photo-resist layer as a mask, the dielectric layer, the first conductive layer, the tunneling oxide layer, and the substrate are etched by a time control anisotropic etching process to form a plurality of trenches in the substrate so that an active area, defined by every two trenches, is simultaneously formed.

The photo-resist layer is removed. A plurality of shallow trench isolation (STI) structures is formed in the trenches by filling the trenches with silicon oxide up to the dielectric layer. The top portion of the shallow trench isolation structures is removed by a reactive ion etching process to further expose the sidewall of the dielectric layer and a top portion of the sidewall of the first conductive layer. Part of the dielectric layer is removed by hot phosphoric acid.

Thereafter, a second conductive layer is formed on the dielectric layer and the shallow trench isolation structures, wherein the material for forming the second conductive layer comprises polysilicon. The second conductive layer is etched anisotropically to further expose the top and the face of the shallow trench isolation structures to form a floating gate and a conductive spacer is formed. The remaining dielectric layer is also removed by hot phosphoric acid. A conformal insulation layer is formed over the substrate. A third conductive layer is formed on the dielectric layer as a control gate, wherein the material for forming the second conductive layer is comprises polysilicon.

In conclusion, the invention allows the floating gate to be formed by a self-aligned method, and only one photolithographic process is needed. For this reason, the fabrication cost is also greatly reduced.

Moreover, the contact area between the floating gate and the control gate of the gate structure made by the method disclosed in this invention enjoys at least a 10% increase over that of the conventional "elephant-ears" stacked flash memory manufactured under identical conditions. Because the coupling ratio is proportional to the contact area between the floating gate and the control gate, the coupling ratio of the gate structure will also increase at least 10%.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the preferred embodiment, with reference made to the accompanying drawings as follows.

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
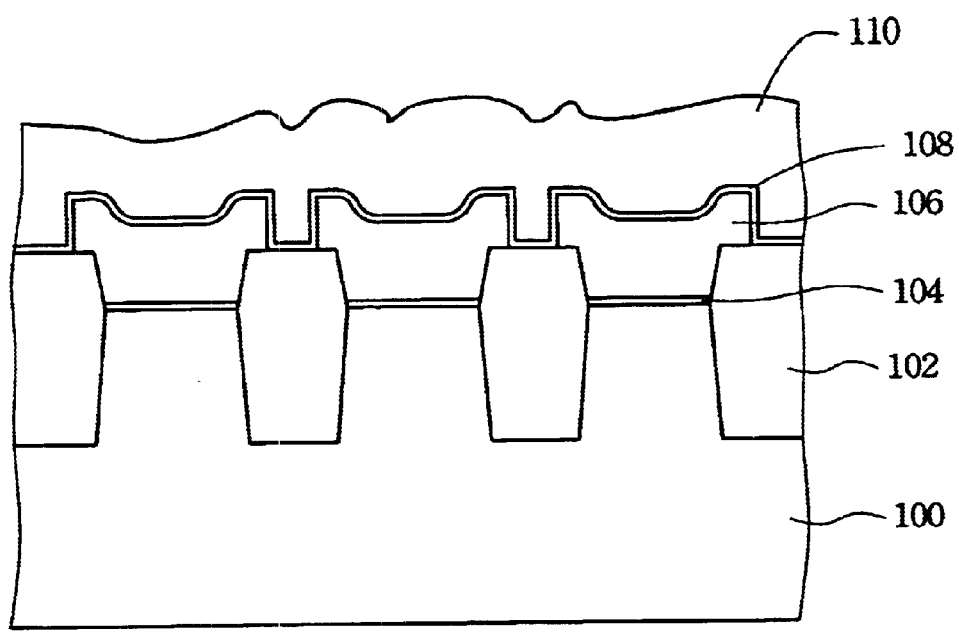
FIG. 1 is a schematic, cross-sectional diagram showing an "elephant-ears" floating gate structure as disclosed in the prior art.

Reference will now be made in detail to the present preferred embodiments of the invention, examples of which are illustrated in the accompanying drawings. Wherever possible, the same reference numbers are used in the drawings and the description to refer to the same or like parts.

Figure 2:
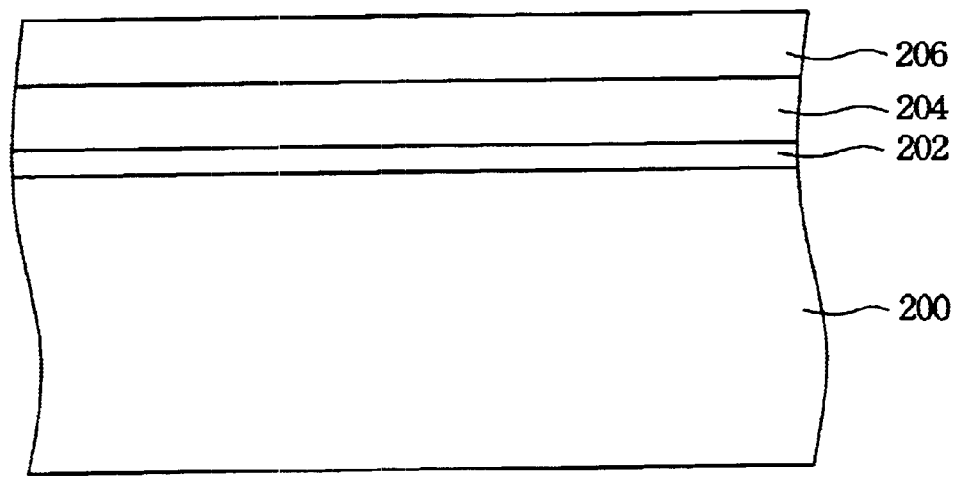
FIGS. 2 to 8 are schematic, cross-sectional diagrams showing processes for fabricating a gate structure of a stacked flash memory according to the preferred embodiment of the present invention.

Reference is made to FIG. 2, in which a tunneling oxide layer 202, a polysilicon layer 204 and a silicon nitride layer 206 are sequentially formed on a substrate 200. Typically, the tunneling oxide layer 202 is formed by a thermal process. The polysilicon layer 204 and the silicon nitride layer 206 are formed by a chemical vapor deposition (CVD) process. The thickness of the tunneling oxide layer 202 is between about 20 and 150 angstroms, the thickness of the polysilicon layer 204 is between about 400 and 1500 angstroms and the thickness of the silicon nitride layer 206 is between about 700 and 2000 angstroms.

Figure 3:
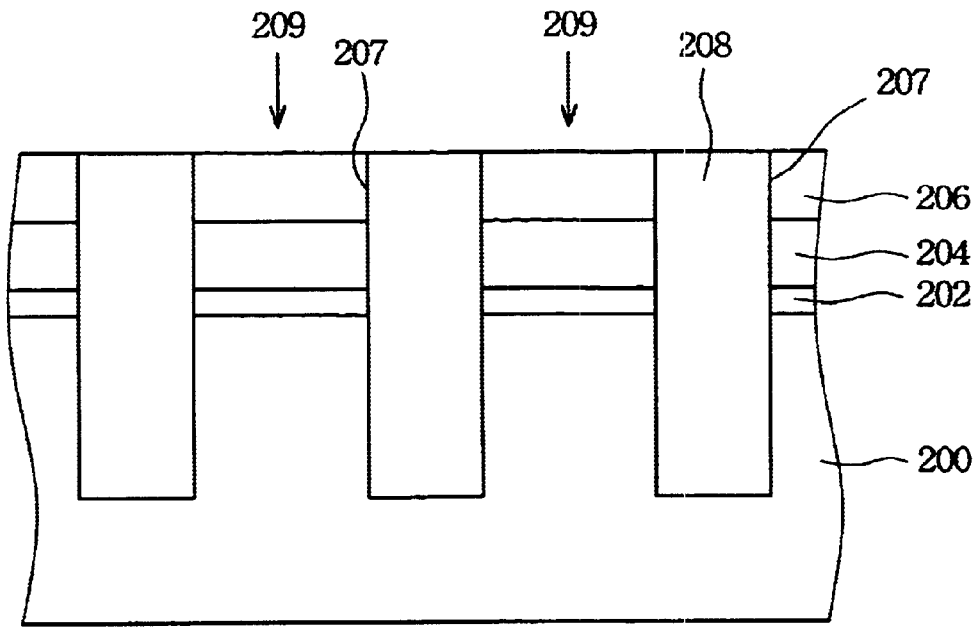

Reference is made to FIG. 3, in which a photo-resist layer (not shown in the FIG. 3) is formed on the silicon nitride layer 206 by spin or vapor coating and the photo-resist layer is patterned by an exposure and development process. Using the photo-resist layer as a mask, the silicon nitride layer 206, the polysilicon layer 204, the tunneling oxide layer 202 and the substrate 200 are etched by a time control anisotropic etching process to form a plurality of trenches 207 in the substrate 200 so that an active area 209, defined by every two trenches 207, is simultaneously formed.

With further reference to FIG. 3, the photo-resist layer is removed. A plurality shallow trench isolation (STI) structures 208 is formed in the trenches 207 by filling the trenches 207 with silicon oxide. Silicon oxide over the silicon nitride layer 206 is removed by chemical mechanical polishing (CMP).

Figure 4:
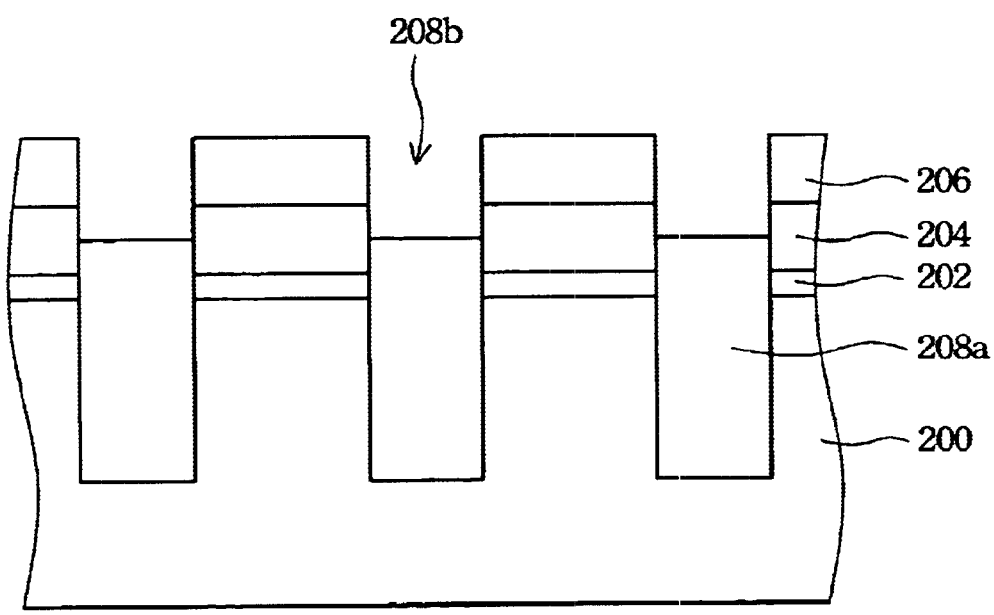

Reference is made to FIG. 4, where the top portion of the shallow trench isolation structures 208 is removed and recess 208b is formed by a reactive ion etching process to expose the sidewall of the silicon nitride layer 206 and top portion sidewall of the polysilicon layer 204. The depth of the recess 208b is about between 700 and 3500 angstroms.

Figure 5:
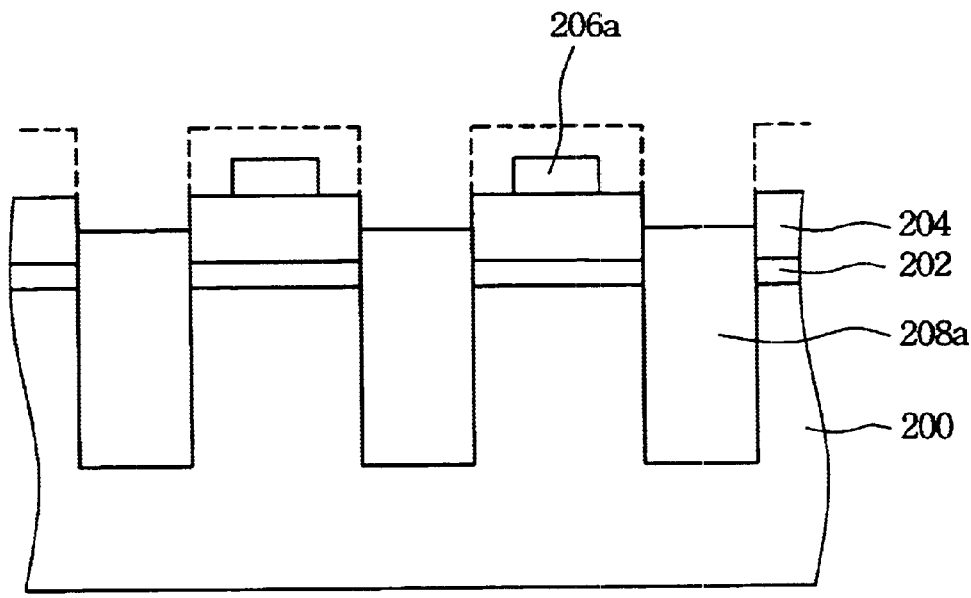

Reference is made to FIG. 5, in which part of the silicon nitride layer 206 is removed by a wet etching process and silicon nitride layer 206a is formed. The solution used in the wet etching process includes hot phosphoric acid. The thickness removed from the silicon nitride layer 206 is between about 100 and 1600 angstroms.

Figure 6:
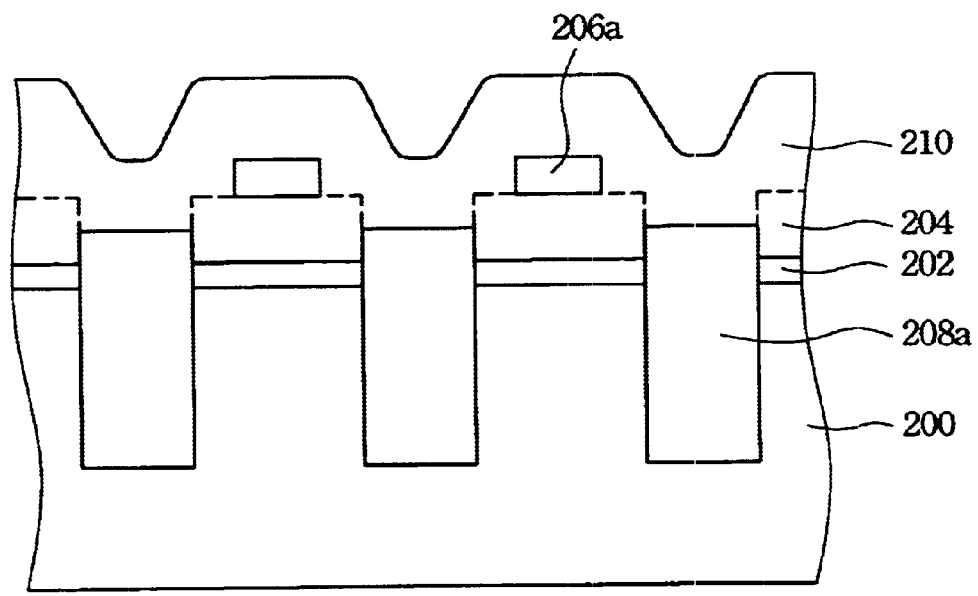

Reference is next made to FIG. 6, where a polysilicon layer 210 is formed on the silicon nitride layer 206a and the shallow trench isolation structures 208a. Because the same material is used for forming polysilicon layer 210 and the polysilicon 206, the boundary of these two layers is not very clear.

Figure 7:
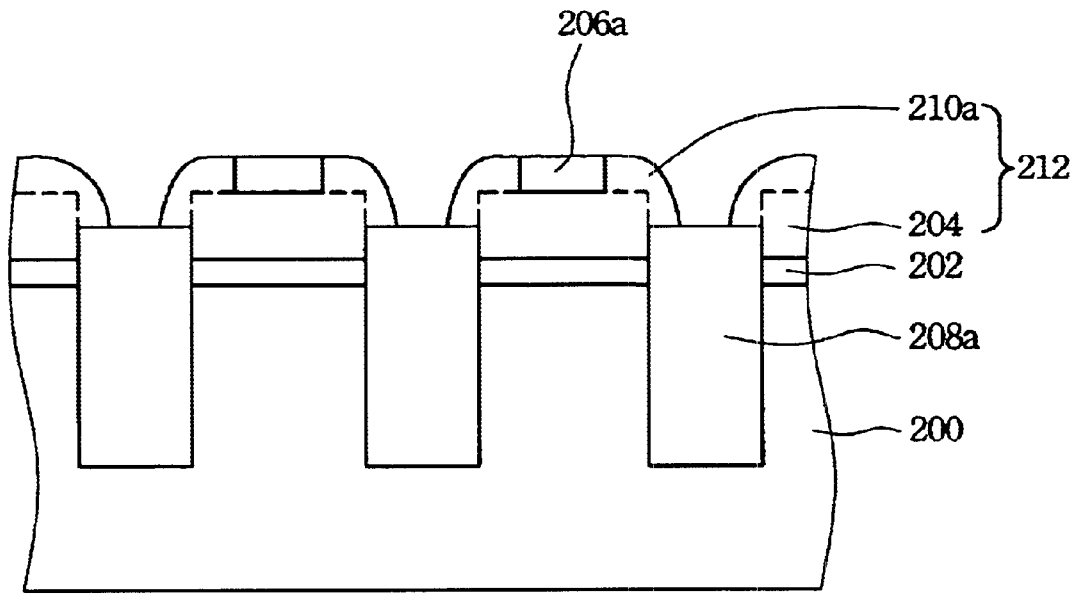

Reference is made to FIG. 7, where the polysilicon layer 210 is etched anisotropically by reactive ion etching to expose the top face of the shallow trench isolation structures 208a and the silicon nitride layer 206a to form a spacer 210a. A floating gate 212 is composed of the polysilicon spacer 210a and the polysilicon layer 204.

Figure 8:
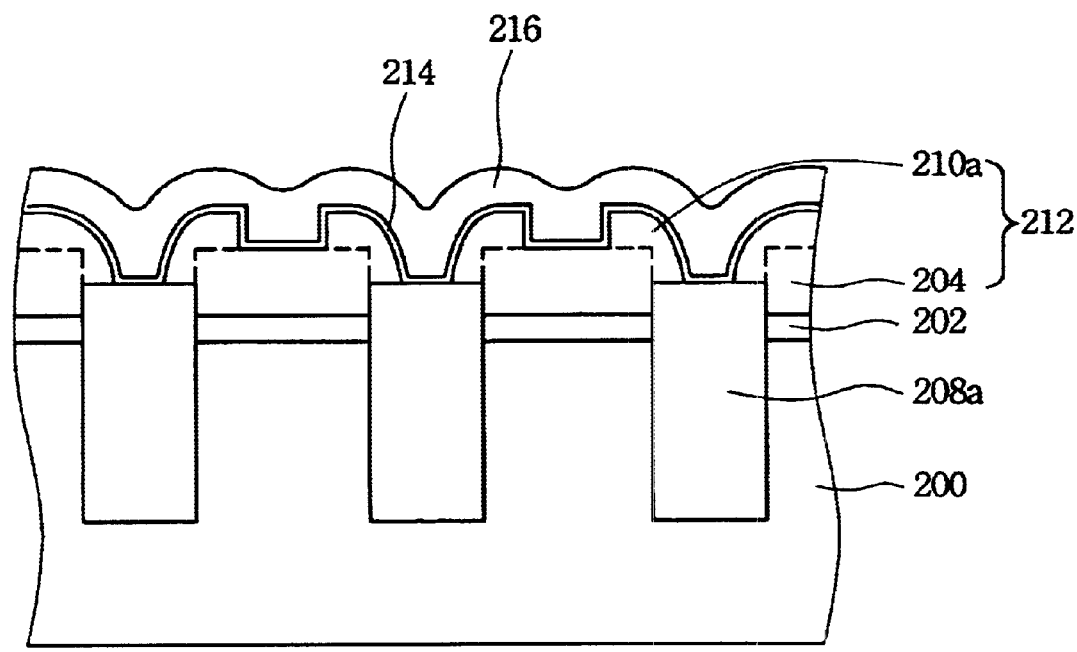

Reference is made to FIG. 8, where the remaining silicon nitride layer 206a is also removed by hot phosphoric acid. Afterwards, a conformal dielectric layer 214 is formed over the floating gate 212 and the shallow trench isolation structures 208a. The material for forming the dielectric layer 214 is a nitride/oxide/nitride deposited by CVD. Then, a polysilicon layer 216 is formed on the dielectric layer 214 as a control gate. The polysilicon layer 216 is also formed by a CVD process. The thickness of the polysilicon layer 216 is between about 500 and 2000 angstroms.

The contact area between the floating gate and the control gate of the gate structure made by the method disclosed in this embodiment increases by at least 10% over that of the "elephant-ears" stacked flash memory manufactured under identical manufacturing conditions. Therefore, the coupling ratio of the gate structure made by the method disclosed in this embodiment will also increase by at least 10%.

In addition to a 10%-higher coupling ratio, the floating gate is not only formed by a self-aligned method, but only one photolithographic process is needed. The self-aligned process will avoid misalignment when forming the floating gate and the yield will increase. For this reason, the fabrication cost is also greatly reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a gate of a flash memory, the method comprising:

providing a substrate;

forming a tunneling oxide layer on the substrate;

forming a first conductive layer on the tunneling oxide layer;

forming a dielectric layer on the first conductive layer;

forming a plurality shallow trench isolation (STI) structures in the substrate, wherein an active area, defined by every two shallow trench isolation structures, is simultaneously formed;

removing a top portion of the shallow trench isolation structures to expose a sidewall of the dielectric layer and portion of a sidewall of the first conductive layer;

a first etching process to remove part of the dielectric layer;

forming a second conductive layer on the active area and the shallow trench isolation structures;

a second etching process to remove the second conductive layer to expose a top face of the shallow trench isolation structures;

removing the dielectric layer;

forming a conformal insulation layer over the substrate; and forming a third conductive layer on the conformal insulation layer.

2. The method of claim 1, wherein a material for forming the first conductive layer, the second conductive layer and the third conductive layer is comprising polysilicon.

3. The method of claim 1, wherein a material for forming the dielectric layer is silicon nitride.

4. The method of claim 1, wherein a thickness of the tunneling oxide layer is between about 20 and 150 angstroms.

5. The method of claim 1, wherein a thickness of the first conductive layer is between about 400 and 1500 angstroms.

6. The method of claim 1, wherein a thickness of the dielectric layer is between about 700 and 2000 angstroms.

7. The method of claim 1, wherein a thickness of the removed top portion of the shallow trench isolation structures is between about 700 and 3500 angstroms.

8. The method of claim 1, wherein a thickness of the removed part of the dielectric layer is between about 100 and 1600 angstroms.

9. The method of claim 1, wherein the thickness of the third conductive layer is between about 500 and 2000 angstroms.

10. The method of claim 1, wherein removing the dielectric layer comprises a wet etching.

11. The method of claim 1, wherein the second etching process comprises a reactive ion etching.

12. The method of claim 1, wherein the conformal insulation layer comprises a N/O/N structure.

13. The method of claim 1, wherein the first etching process comprises an isotropic etching process.

14. The method of claim 1, wherein the second etching process comprises an anisotropic etching process.

15. A method for fabricating a gate of a flash memory, the method comprising:

providing a substrate;

forming sequentially a tunneling oxide layer, a first polysilicon layer and a silicon nitride layer on the substrate;

forming a plurality of shallow trench isolation (STI) structures in the substrate, wherein an active area, defined by every two STI, is simultaneously formed;

removing a top portion of the shallow trench isolation structures to expose a sidewall of the silicon nitride layer and portion of a sidewall of the first polysilicon layer;

etching isotropically and removing a part of the silicon nitride layer;

forming a spacer on the sidewall of the silicon nitride layer and the top portion of the sidewall of the first polysilicon layer;

removing the silicon nitride layer;

forming a conformal dielectric layer over the substrate; and forming a second polysilicon layer on the conformal dielectric layer.

16. The method of claim 15, wherein a material of the spacer is polysilicon.

17. The method of claim 15, wherein forming the spacer forming a third polysilicon layer on the active area and the shallow trench isolation structures; and an anisotropically etching the third polysilicon layer to expose a top face of the shallow trench isolation structures.

18. The method of claim 17, wherein anisotropically etching the third polysilicon layer comprises reactive ion etching.

19. The method of claim 15, wherein a thickness of the tunneling oxide layer is between about 20 and 150 angstroms.

20. The method of claim 15, wherein a thickness of the first polysilicon layer is between about 400 and 1500 angstroms.

21. The method of claim 15, wherein a thickness of the silicon nitride layer is between about 700 and 2000 angstroms.

22. The method of claim 15, wherein a thickness of the removed top portion of the shallow trench isolation structures is between about 700 and 3500 angstroms.

23. The method of claim 15, wherein the thickness of the removed part of the silicon nitride layer is between about 100 and 1600 angstroms.

24. The method of claim 15, wherein a thickness of the second polysilicon layer is between about 500 and 2000 angstroms.

25. The method of claim 15, wherein removing the silicon nitride layer comprises wet etching.

26. The method of claim 15, wherein the conformal dielectric layer comprises a N/O/N structure.

* * * * *